US010447229B2

United States Patent
Sung et al.

(10) Patent No.: US 10,447,229 B2
(45) Date of Patent: Oct. 15, 2019

(54) MATCHING MODULE

(71) Applicant: SAMSUNG ELECTRO-MECHANICS CO., LTD., Suwon-si (KR)

(72) Inventors: Jung Woo Sung, Suwon-si (KR); Dong Hoe Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 33 days.

(21) Appl. No.: 15/797,387

(22) Filed: Oct. 30, 2017

(65) Prior Publication Data

US 2018/0302057 A1 Oct. 18, 2018

(30) Foreign Application Priority Data

Apr. 17, 2017 (KR) .................. 10-2017-0049064

(51) Int. Cl.
| | | |
|---|---|---|
| H01Q 1/50 | (2006.01) | |
| H03H 7/38 | (2006.01) | |
| H01F 27/28 | (2006.01) | |
| H01F 27/40 | (2006.01) | |
| H01P 1/213 | (2006.01) | |
| H01F 17/00 | (2006.01) | |
| H01G 4/40 | (2006.01) | |
| H01Q 5/50 | (2015.01) | |
| H03H 1/00 | (2006.01) | |

(52) U.S. Cl.
CPC .......... *H03H 7/38* (2013.01); *H01F 17/0006* (2013.01); *H01F 27/2804* (2013.01); *H01F 27/40* (2013.01); *H01P 1/2135* (2013.01); *H01Q 1/50* (2013.01); *H01F 2017/0073* (2013.01); *H01G 4/40* (2013.01); *H01Q 5/50* (2015.01); *H03H 2001/0085* (2013.01)

(58) Field of Classification Search
CPC ... H01Q 1/50; H01P 1/20; H01P 1/203; H01P 1/20345; H01P 9/006; H03H 7/18
See application file for complete search history.

(56) References Cited

U.S. PATENT DOCUMENTS

| | | | | |
|---|---|---|---|---|
| 4,369,557 A | * | 1/1983 | Vandebult | G06K 19/0672 257/E27.114 |
| 8,110,895 B2 | * | 2/2012 | Imaoka | H01L 23/49838 257/531 |
| 2007/0035363 A1 | * | 2/2007 | Kameya | H03H 7/30 333/140 |

FOREIGN PATENT DOCUMENTS

KR 10-1114091 B1 2/2012

* cited by examiner

*Primary Examiner* — Hoang V Nguyen
(74) *Attorney, Agent, or Firm* — NSIP Law

(57) ABSTRACT

A matching module includes an inductor pattern including a first inductor pattern and a second inductor pattern, each respectively provided in a spiral shape, and a connection pattern connecting the first inductor pattern and the second inductor pattern and provided in a central region of a dielectric sheet, and a capacitor pattern provided in an edge region of the dielectric sheet and configured to form mutual capacitance with the inductor pattern, wherein rotational directions of the first inductor pattern and the second inductor pattern that are provided in the spiral shape are the same.

20 Claims, 4 Drawing Sheets

MATCHING MODULE

CROSS-REFERENCE TO RELATED APPLICATIONS

This application claims the benefit under 35 USC 119(a) of Korean Patent Application No. 10-2017-0049064 filed on Apr. 17, 2017 in the Korean Intellectual Property Office, the entire disclosure of which is incorporated herein by reference for all purposes.

BACKGROUND

1. Field

The following description relates to a matching module.

2. Description of Related Art

With the recent development of mobile communication systems, mobile devices are rapidly spreading. Accordingly, demand for miniaturization and high performance in a large number of electronic parts used in mobile devices is increasing. Among such electronic parts, a duplexer is responsible for functions of separating a transmitting signal and a receiving signal. and simultaneously extracting only a signal of a necessary frequency band. A duplexer is an essential component in a transmitting/receiving communication method such as an analog or Code Division Multiple Access (CDMA) method.

Such a duplexer includes a transmitting filter, a receiving filter, and a matching module for separating a transmitting signal of the transmitting filter and a receiving signal of the receiving filter. The matching module separates the transmitting signal and the receiving signal to minimize interference between the transmitting signal and the receiving signal. The matching module is configured to minimize an influence on electrical characteristics of the transmitting filter and the receiving filter. For example, the matching module may be represented as an equivalent circuit in which a capacitor-inductor-capacitor is connected in a form of a pi (π) filter. In order to change a phase while maintaining a matched frequency band of the matching module, capacitances of two capacitors may need to be the same. However, there may be a problem in that the capacitances of the two capacitors are possibly different due to a parasitic capacitance incidentally generated in the matching module.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a matching module includes an inductor pattern including a first inductor pattern and a second inductor pattern, each respectively provided in a spiral shape, and a connection pattern connecting the first inductor pattern and the second inductor pattern and provided in a central region of a dielectric sheet, and a capacitor pattern provided in an edge region of the dielectric sheet and configured to form mutual capacitance with the inductor pattern, wherein rotational directions of the first inductor pattern and the second inductor pattern have a same rotational direction.

The first inductor pattern and the second inductor pattern may be provided symmetrical with respect to each other.

The first inductor pattern and the second inductor pattern may be rotationally symmetrical with respect to each other.

A direction of a signal path of a pattern arranged in parallel, adjacent to the connection pattern in an outermost loop of each of the first inductor pattern and the second inductor pattern, may be a same direction as a direction of a signal path of the connection pattern.

The first inductor pattern, the second inductor pattern, and the connection pattern may be formed to be continuous.

The mutual capacitance may be generated between the capacitor pattern and an outermost loop of each of the first inductor pattern and the second inductor pattern.

A terminal disposed in a center of the first inductor pattern provided in the spiral shape may be connected to either one or both of a transmitting filter and an antenna, and a terminal disposed in a center of the second inductor pattern provided in the spiral shape may be connected to a receiving filter.

The capacitor pattern may be connected to a ground.

The capacitor pattern may be insulated from the first inductor pattern, the second inductor pattern, and the connection pattern.

In another general aspect, a matching module includes an inductor connected between a transmitting terminal and a receiving terminal, a first capacitor connected between the transmitting terminal and a ground, and a second capacitor connected between the receiving terminal and the ground, wherein the inductor is formed using an inductor pattern comprising a first inductor pattern and a second inductor pattern, each respectively provided in a spiral shape, and a connection pattern connecting the first inductor pattern and the second inductor pattern, and wherein the first inductor pattern and the second inductor pattern have a same rotational direction.

The first capacitor and the second capacitor may be insulated from the inductor pattern and may be formed using a capacitor pattern that forms mutual capacitance with the inductor pattern.

The first inductor pattern and the second inductor pattern may be symmetrical with respect to each other.

The first inductor pattern and the second inductor pattern may be rotationally symmetrical with respect to each other.

A direction of a signal path of a pattern arranged in parallel, adjacent to the connection pattern in an outermost loop of each of the first inductor pattern and the second inductor pattern may be a same direction as a direction of a signal path of the connection pattern.

The first inductor pattern, the second inductor pattern, and the connection pattern may be formed to be continuous.

The mutual capacitance may be generated between the capacitor pattern and an outermost loop of each of the first inductor pattern and the second inductor pattern.

The capacitor pattern may be connected to a ground.

The capacitor pattern may be insulated from the first inductor pattern, the second inductor pattern, and the connection pattern.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
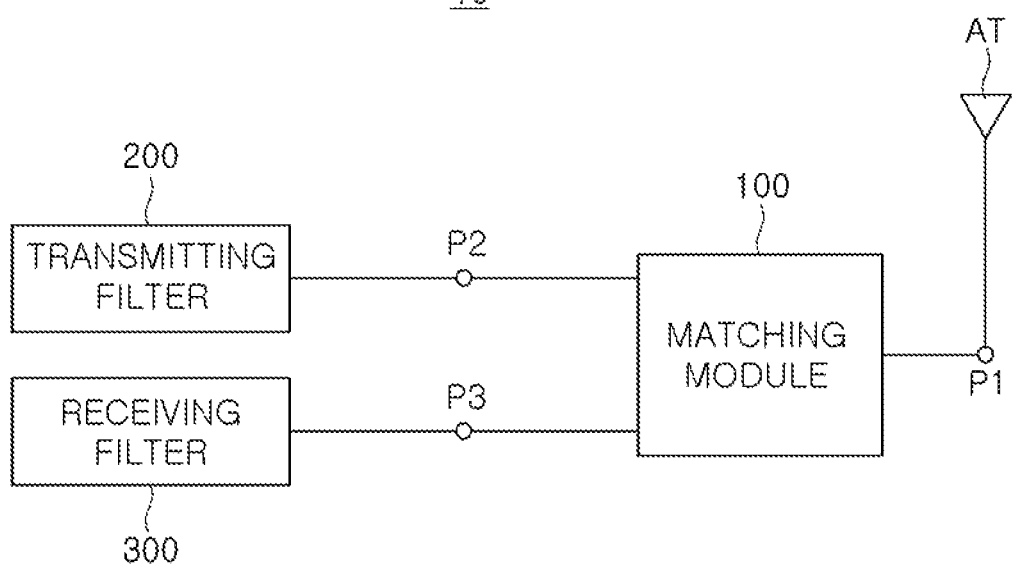
FIG. 1 is a block diagram of a duplexer according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples will be described in further detail with reference to the accompanying drawings.

An aspect of the present disclosure provides a matching module in which at least two capacitors have the same capacitance.

FIG. 1 is a block diagram of a duplexer according to an example.

Referring to the example of FIG. 1, a duplexer 10, according to such an example, includes a matching module 100, a transmitting filter 200, and a receiving filter 300. The matching module 100 is connected to an antenna AT through a first port P1, to the transmitting filter 200 through a second port P2, and to the receiving filter 300 through a third port P3.

The transmitting filter 200 transmits a transmitting signal filtered through the antenna AT. The receiving filter 300 filters a receiving signal received through the antenna AT. For example, the transmitting filter 200 and the receiving filter 300 may include a thin film bulk acoustic resonator capable of realizing a high quality factor. A thin film bulk acoustic resonator is a device formed of piezoelectric material sandwiched between two electrodes, and has resonance properties that allow such a resonator to act as a filter. In such an example, the matching module 100 minimizes interference between the transmitting signal and the receiving signal by separating the transmitting signal and the receiving signal.

Figure 2:
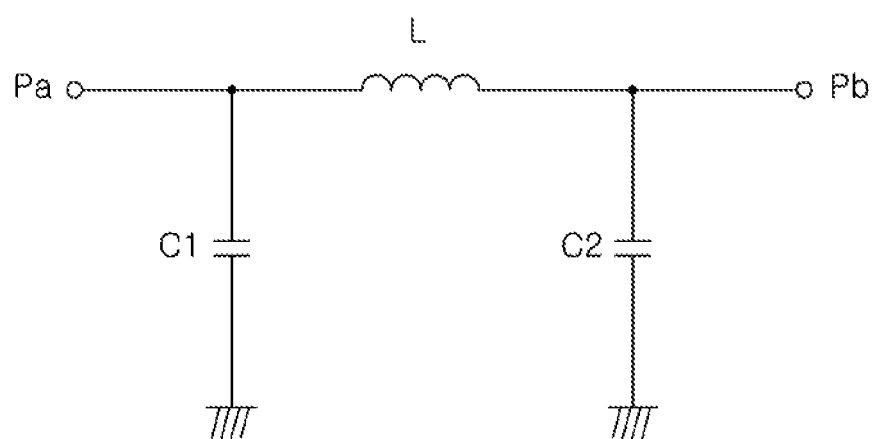
FIG. 2 is an equivalent circuit diagram of a matching module according to an example.

FIG. 2 is an equivalent circuit diagram of a matching module according to an example.

Referring to the example of FIG. 2, an equivalent circuit of the matching module 100 includes one inductor L and at least two capacitors C1 and C2. For example, the equivalent circuit of the matching module 100 is a circuit in which the one inductor L and the two capacitors C1 and C2 are connected in the form of a pi ($\pi$) filter. Specifically, in such an example, the inductor L is connected between a transmitting terminal Pa and a receiving terminal Pb. Additionally, the first capacitor C1 of the two capacitors C1 and C2 is disposed between the transmitting terminal Pa and a ground, and the second capacitor C2 is disposed between the receiving terminal Pb and a ground. Likewise, the transmitting terminal Pa is connected to the first port P1 and the second port P2 of FIG. 1 and the receiving terminal Pb is connected to the third port P3 of FIG. 1.

In one example, the capacitances of the first capacitor C1 and the second capacitor C2 have the same capacitance in order for the matching module 100 to change a phase while maintaining a matched region. However, due to a parasitic capacitance incidentally generated in the matching module 100, the capacitances of the first and second capacitors C1 and C2 are possibly different from each other.

Figure 3:
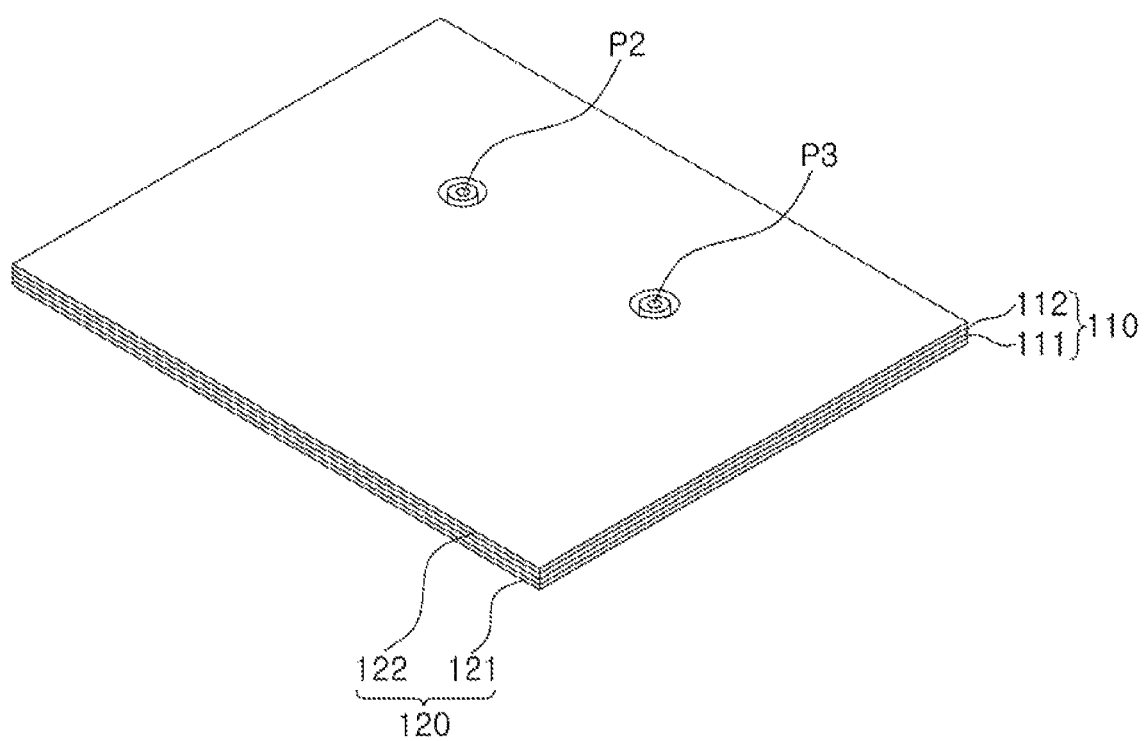
FIG. 3 is an assembled perspective view of a matching module according to an example.
Figure 4:
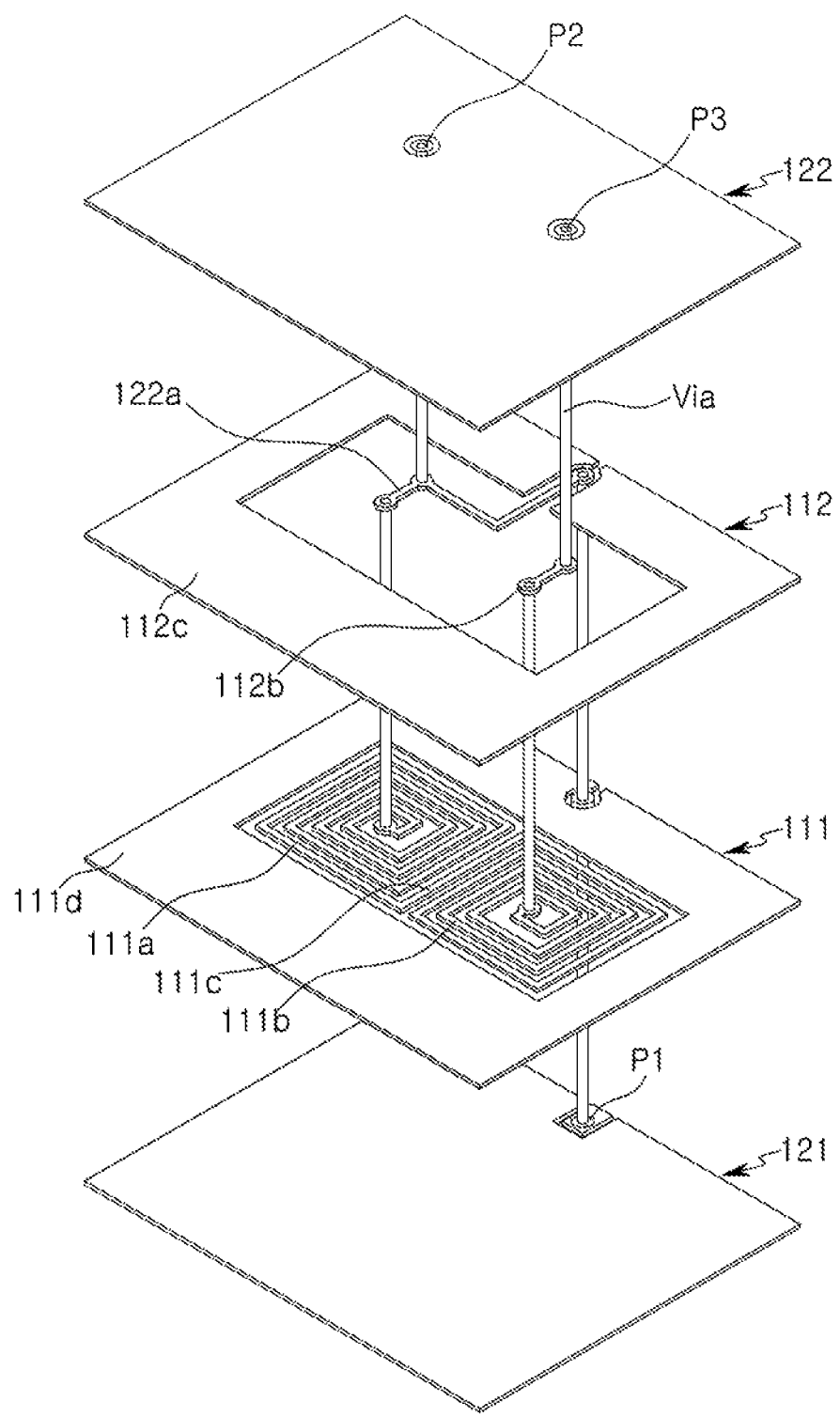
FIG. 4 is an exploded perspective view of a matching module according to an example.

FIG. 3 is an assembled perspective view of a matching module according to an example. FIG. 4 is an exploded perspective view of a matching module according to an example. Referring to the examples of FIGS. 3 and 4, the matching module 100 includes a stack dielectric sheet 110, and a ground portion 120 disposed at upper and lower portions of the stack dielectric sheet 110.

The stack dielectric sheet 110 includes at least two dielectric sheets. For example, the dielectric sheet is generally implemented as a rectangular dielectric sheet of a ceramic material or alternatively is implemented by using different shapes and materials. As an example, as shown in the example of FIG. 3, the stack dielectric sheet 110 includes a first dielectric sheet 111 and a second dielectric sheet 112.

The first dielectric sheet 111 includes at least one pattern used to implement the inductor L and the at least two capacitors C1, C2 of the example of FIG. 2.

Figure 5:
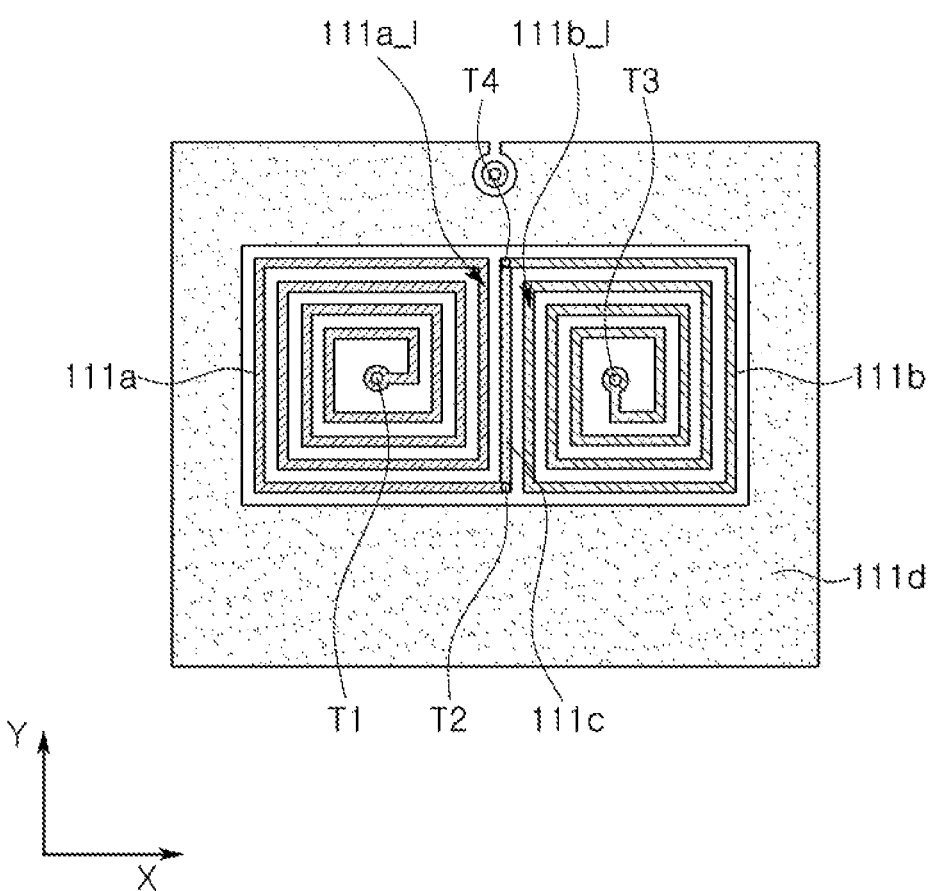
FIG. 5 is a top view of a first dielectric sheet according to an example.

FIG. 5 is a top view of a first dielectric sheet according to an example.

Referring to the examples of FIGS. 3 to 5, the first dielectric sheet 111 includes a first inductor pattern 111a, a second inductor pattern 111b, a connection pattern 111c, and a capacitor pattern 111d.

The first inductor pattern 111a, the second inductor pattern 111b and the connection pattern 111c corresponding to inductor patterns are electrically connected to first through third ports P1, P2, P3 respectively corresponding to an antenna port, a transmitting port, and a receiving port through vias. In the example of FIG. 5, the first inductor pattern 111a is connected to the first port P1 formed in a first ground portion 121 and the second port P2 formed in a second ground portion 122 through the via. The second inductor pattern 111b is connected to the third port P3 formed in the second ground portion 122.

In such an example, each of the first inductor pattern 111a and the second inductor pattern 111b is formed by a conductive pattern in a spiral shape. For example, the first inductor pattern 111a and the second inductor pattern 111b provided in the spiral shape may have the same rotational direction.

Thus, according to the example of FIG. 5, the first inductor pattern 111a is provided in the spiral shape in relation to a first terminal T1 and terminates at a second terminal T2. In this manner, the first terminal T1 corresponds to the transmitting terminal Pa of the example of FIG. 2.

In an example, the second inductor pattern 111b is provided in the spiral shape in relation to a third terminal T3 and terminates at a fourth terminal T4. In this manner, the third terminal T3 corresponds to the receiving terminal Pb of the example of FIG. 2.

The connection pattern 111c is provided between the second terminal T2 and the fourth terminal T4 and connects the first inductor pattern 111a and the second inductor pattern 111b. For example, the connection pattern 111c may be formed in a linear shape between the first inductor pattern 111a and the second inductor pattern 111b. In the example of FIG. 5, although the first inductor pattern 111a, the second inductor pattern 111b, and the connection pattern 111c corresponding to the inductor patterns are named separately for convenience of description, in another example the first inductor pattern 111a, the second inductor pattern 111b, and the connection pattern 111c may be formed to be continuous, so as to have the same material and shape.

The first inductor pattern 111a and the second inductor pattern 111b are configured to have rotational and symmetrical correspondence. In an example, the first inductor pattern 111a and the second inductor pattern 111b are provided symmetrically with respect to each other. When one of the first inductor pattern 111a and the second inductor pattern 111b is rotated 90 degrees, it has the same arrangement as an arrangement of the other one.

Specifically, in the example of FIG. 5, when the first inductor pattern 111a is rotated 90 degrees clockwise and then moved in an appropriate direction with respect to the X axis direction, the first inductor pattern 111a and the second inductor pattern 111b overlap with each other. Conversely, when the second inductor pattern 111b is rotated 90 degrees counterclockwise and then moved in a direction opposite to the X axis direction, the second inductor pattern 111b and the first inductor pattern 111a overlap with each other.

The capacitor pattern 111d is formed by being insulated from the first inductor pattern 111a, the second inductor pattern 111b, and the connection pattern 111c. For example, the capacitor pattern 111d is formed in an edge region of the first dielectric sheet 111. Accordingly, the first inductor pattern 111a, the second inductor pattern 111b, and the connection pattern 111c are formed in a central region of the first dielectric sheet 111. Thus, in the example of FIG. 5, the capacitor pattern 111d is insulated from the first inductor pattern 111a, the second inductor pattern 111b, and the connection pattern 111c. In such an example, the capacitor pattern 111d may be provided with a ground potential from the ground portion 120 as shown in FIG. 3 through a via different from the via connected to the first inductor pattern 111a and the second inductor pattern 111b.

The capacitor pattern 111d is connected to the ground portion 120 to maintain the ground potential. A transmitting signal and a receiving signal are transmitted and received through any one or any combination of two or more of the first port P1, the second port P2 and the third port P3. Such signals are provided to the inductor pattern. In this example, the inductor pattern includes the first inductor pattern 111a, the second inductor pattern 111b, and the connection pattern 111c, between the inductor pattern and the capacitor pattern 111d that maintains the ground potential. In particular, the ground potential is maintained between an outermost loop of each of the first inductor pattern 111a and the second inductor pattern 111b and the capacitor pattern 111d. In such an example, a mutual capacitance component is generated between the elements and the mutual capacitance component potentially acts as the first capacitor C1 and the second capacitor C2 of the example of FIG. 2.

According to an example, the first inductor pattern 111a and the second inductor pattern 111b are provided symmetrically so that the capacitances of the first and second capacitors C1 and C2 may be formed to be the same.

A direction of a signal path of a pattern disposed in parallel, located adjacent to the connection pattern 111c in the outermost loop of each of the first inductor pattern 111a and the second inductor pattern 111b may be the same as a direction of a signal path of the connection pattern 111c. For example, assuming that a signal path is formed in the order of the first terminal T1, the second terminal T2, the fourth terminal T4, and the third terminal T3, a direction of a signal path of a pattern 111a_I disposed in parallel, located adjacent to the connection pattern 111c in the outermost loop of the first inductor pattern 111a is formed in a Y axis direction, and the direction of a signal path of the connection pattern 111c is formed in the Y axis direction. Also, a direction of a signal path of a pattern 111b_I disposed in parallel, located adjacent to the connection pattern 111c in the outermost loop of the second inductor pattern 111b is formed in the Y axis direction, and the direction of a signal path of the connection pattern 111c is formed in the Y axis direction.

According to an example, the directions of the signal paths of the patterns 111a_I and 111b_I arranged in parallel, adjacent to the connection pattern 111c in the outermost loop of each of the first inductor pattern 111a and the second inductor pattern 111b are formed to be the same as the direction of the signal path of the connection pattern 111c. Thus, the interference between inductance components generated by the first inductor pattern 111a, the second inductor pattern 111b, and the connection pattern 111c are potentially excluded.

Referring to the examples of FIGS. 3 and 4 again, the second dielectric sheet 112 includes one or more wiring patterns 112a, 112b.

The wiring patterns 112a and 112b connect the first port P1, the second port P2 and the third port P3 provided in the ground portion 120 and the first inductor pattern 111a and the second inductor pattern 111b.

The wiring patterns 112a and 112b include a first wiring pattern 112a and a second wiring pattern 112b. The first wiring pattern 112a is connected to the first port P1 formed on the first ground portion 121, the second port P2 formed on the second ground portion 122, and the first inductor pattern 111a formed on the first dielectric sheet 111. Such a connection occurs through vias used to connect the first port P1, the second port P2 and the first inductor pattern 111a to each other. Also, the second wiring pattern 112b is connected to the third port P3 formed in the second ground portion 122 and the second inductor pattern 112b formed in the first dielectric sheet 111 through a via used to connect the third port P3 and the second inductor pattern 112b to each other.

In the example of FIG. 4, the second dielectric sheet 112 additionally includes an auxiliary capacitor pattern 112c. In such an example, the auxiliary capacitor pattern 112c, like the capacitor pattern 111d, is connected to the ground portion 120 to maintain a ground potential. The auxiliary capacitor pattern 112c of the second dielectric sheet 112 is formed to have the same shape as the capacitor pattern 111d of the first dielectric sheet 111. Using such a same shape increases a level of mutual capacitance generated by the capacitor pattern 111d.

The ground portion 120 is provided on upper and lower portions of the stack dielectric sheet 110 to provide a ground potential. The ground portion 120 includes the first ground portion 121 disposed in the lower portion of the stack dielectric sheet 110 and the second ground portion 122 disposed in the upper portion of the stack dielectric sheet 110. For example, the first grounding portion 121 is disposed in a lower portion of the first dielectric sheet 111 and the second ground portion 122 is disposed in an upper portion of the second dielectric sheet 112.

In the examples of FIGS. 2-3, the first port P1, the second port P2 and the third port P3 are formed in the first ground portion 121 and the second ground portion 122. The first port P1, the second port P2 and the third port P3 of FIGS. 3 and 4 respectively correspond to the first port P1, the second port P2, and the third port P3 of FIG. 1.

In such examples, the first port P1 is formed in the first ground portion 121 and the second port P2 and the third port P3 are formed in the second ground portion 122. Thus, the first port P1, the second port P2 and the third port P3 formed in the first ground portion 121 and the second ground portion 122 are designed to be isolated and insulated from the ground potential.

As set forth above, the matching module according to an example maintains the same capacitance of at least two capacitors provided in an equivalent circuit and changes a phase while also maintaining a matched frequency band.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A matching module, comprising:
    an inductor pattern comprising a first inductor pattern and a second inductor pattern, each respectively provided in a spiral shape, and a connection pattern connecting the first inductor pattern and the second inductor pattern and provided in a central region of a dielectric sheet; and
    a capacitor pattern provided in an edge region of the dielectric sheet and configured to form mutual capacitance with the inductor pattern,
    wherein the first inductor pattern and the second inductor pattern comprise a same rotational direction.

2. The matching module of claim 1, wherein the first inductor pattern and the second inductor pattern are provided symmetrical with respect to each other.

3. The matching module of claim 2, wherein the first inductor pattern and the second inductor pattern are rotationally symmetrical with respect to each other.

4. The matching module of claim 1, wherein a direction of a signal path of a pattern arranged in parallel, adjacent to the connection pattern in an outermost loop of each of the first inductor pattern and the second inductor pattern, is a same direction as a direction of a signal path of the connection pattern.

5. The matching module of claim 1, wherein the first inductor pattern, the second inductor pattern, and the connection pattern are formed to be continuous.

6. The matching module of claim 1, wherein the mutual capacitance is generated between the capacitor pattern and an outermost loop of each of the first inductor pattern and the second inductor pattern.

7. The matching module of claim 1, wherein a terminal disposed in a center of the first inductor pattern provided in the spiral shape is connected to either one or both of a transmitting filter and an antenna, and a terminal disposed in a center of the second inductor pattern provided in the spiral shape is connected to a receiving filter.

8. The matching module of claim 1, wherein the capacitor pattern is connected to a ground.

9. The matching module of claim 1, wherein the capacitor pattern is insulated from the first inductor pattern, the second inductor pattern, and the connection pattern.

10. A matching module, comprising:
an inductor connected between a transmitting terminal and a receiving terminal;
a first capacitor connected between the transmitting terminal and a ground; and
a second capacitor connected between the receiving terminal and the ground,
wherein the inductor is formed using an inductor pattern comprising a first inductor pattern and a second inductor pattern, each respectively provided in a spiral shape, and a connection pattern connecting the first inductor pattern and the second inductor pattern,
wherein the first inductor pattern and the second inductor pattern comprise a same rotational direction, and
wherein the first capacitor and the second capacitor are insulated from the inductor pattern and are formed using a capacitor pattern that forms mutual capacitance with the inductor pattern.

11. The matching module of claim 10, wherein the mutual capacitance is generated between the capacitor pattern and an outermost loop of each of the first inductor pattern and the second inductor pattern.

12. The matching module of claim 10, wherein the capacitor pattern is connected to a ground.

13. The matching module of claim 10, wherein the first inductor pattern and the second inductor pattern are symmetrical with respect to each other.

14. The matching module of claim 13, wherein the first inductor pattern and the second inductor pattern are rotationally symmetrical with respect to each other.

15. The matching module of claim 10, wherein a direction of a signal path of a pattern arranged in parallel, adjacent to the connection pattern in an outermost loop of each of the first inductor pattern and the second inductor pattern is a same direction as a direction of a signal path of the connection pattern.

16. The matching module of claim 10, wherein the first inductor pattern, the second inductor pattern, and the connection pattern are formed to be continuous.

17. The matching module of claim 10, wherein the capacitor pattern is insulated from the first inductor pattern, the second inductor pattern, and the connection pattern.

18. The matching module of claim 10, wherein the transmitting terminal and the receiving terminal are disposed on the same dielectric sheet.

19. The matching module of claim 10, wherein the first inductor pattern is connected to the transmitting terminal, and the second inductor pattern is connected to the receiving terminal.

20. A matching module, comprising:
an inductor connected between a transmitting terminal and a receiving terminal;
a first capacitor connected between the transmitting terminal and a ground; and
a second capacitor connected between the receiving terminal and the ground,
wherein the inductor is formed using an inductor pattern comprising a first inductor pattern and a second inductor pattern, each respectively provided in a spiral shape, and a connection pattern connecting the first inductor pattern and the second inductor pattern,
wherein the first inductor pattern and the second inductor pattern comprise a same rotational direction, and
wherein the transmitting terminal and the receiving terminal are disposed on the same dielectric sheet.

* * * * *